US008747626B2

(12) United States Patent
Ding et al.

(10) Patent No.: US 8,747,626 B2
(45) Date of Patent: Jun. 10, 2014

(54) METHOD OF GENERATING HIGH PURITY BISMUTH OXIDE

(75) Inventors: Guowen Ding, San Jose, CA (US); Mohd Fadzli Anwar Hassan, San Francisco, CA (US); Hien Minh Huu Le, San Jose, CA (US); Zhi-Wen Sun, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/307,301

(22) Filed: Nov. 30, 2011

(65) Prior Publication Data

US 2013/0136919 A1 May 30, 2013

(51) Int. Cl.
*C23C 14/08* (2006.01)
*C23C 14/58* (2006.01)

(52) U.S. Cl.
CPC ........... *C23C 14/086* (2013.01); *C23C 14/5806* (2013.01)
USPC ................... 204/192.1; 204/298.13; 428/623; 428/336; 136/256

(58) Field of Classification Search
CPC ........................... C23C 14/086; C23C 14/5806
See application file for complete search history.

(56) References Cited

U.S. PATENT DOCUMENTS 4,883,721 A * 11/1989 Nalepka et al. ............... 428/623
4,943,362 A *  7/1990 Schlamp et al. .......... 204/298.13
2010/0214230 A1 *  8/2010 Chu et al. ..................... 345/173
2010/0243427 A1 *  9/2010 Kozlowski et al. ......... 204/192.1
2011/0232749 A1 *  9/2011 Lienhart et al. ............... 136/256

OTHER PUBLICATIONS

S. H. Mohamed, "Properties of Indium Tin Oxide Thin Films Deposited on Polymer Substrates" Oct. 21, 2008, Acta Physica Polonica A, vol. 115, pp. 704-708.*
Leontie, L., et al.; Structural and Optical Characteristics of Bismuth Oxide Thin Films; Jan. 1, 2002; Academia—Al. I. Cuza University, Romania; Surface Science pp. 480485.
Gujar, T.P., et al.; Bismuth Oxide Thin Films Prepared by Chemical Bath Deposition CBD Method Annealing Effect; Jan. 22, 2005; Academia—Shivaji University, Kolhapur, India; Applied Surface Science pp. 161167.
Leontie, L., et al.; On the Electronic Transport Properties of Bismuth Oxide Thin Films; Mar. 20, 2006; Academia—Al. I. Cuza University, Romania; Journal of NonCrystalline Solids pp. 14751478.

* cited by examiner

*Primary Examiner* — Keith Hendricks
*Assistant Examiner* — Timon Wanga

(57) ABSTRACT

A method for forming and protecting high quality bismuth oxide films comprises depositing a transparent thin film on a substrate comprising one of Si, alkali metals, or alkaline earth metals. The transparent thin film is stable at room temperature and at higher temperatures and serves as a diffusion barrier for the diffusion of impurities from the substrate into the bismuth oxide. Reactive sputtering, sputtering from a compound target, or reactive evaporation are used to deposit a bismuth oxide film above the diffusion barrier.

15 Claims, 2 Drawing Sheets

METHOD OF GENERATING HIGH PURITY BISMUTH OXIDE

FIELD OF THE INVENTION

The present invention relates generally to the formation and protection of high quality bismuth oxide films.

BACKGROUND OF THE INVENTION

Bismuth oxide ($Bi_2O_3$) is a metal oxide that has unusually high ionic conductivity due to the high mobility of oxygen atoms through the structure. Additionally, bismuth oxide is transparent with a high refractive index (between about 2.3 and about 2.5) depending on its different phases. Therefore, it may have potential uses in applications such as solid oxide fuel cells (SOFC), batteries, electrochromic devices, solar cells, display devices, etc. wherein the $Bi_2O_3$ films are commonly deposited directly on a substrate. The Low-emissivity glass needs a high refractive index oxide, where $Bi_2O_3$ could be a candidate due to its high refractive index. However, typically, a temperature treatment (such as above 600 C.) at a short time (such as 8 min) is required in this low emissivity application, although there is no need for this heat treatment for many other $Bi_2O_3$ applications. However, impurities from the substrate could diffuse into the bismuth oxide. At room temperature, a small amount of impurity may diffuse into the bismuth oxide. At higher temperatures, a significant amount of impurity may diffuse into the bismuth oxide. These impurities may negatively impact the performance of the $Bi_2O_3$ layer, depending on the amount of impurity and the required specification of the various applications. As an example, when materials containing Si, alkali, or alkaline earth metals glass are used as the substrate, impurities such as Na, Ca, Si, etc. can easily diffuse out of the substrate and into the bismuth oxide. These impurities impact both the optical and ionic conducting properties of the film. Therefore, there is a need to develop methods for preventing the diffusion of impurities into the bismuth oxide for deposition on glass or substrates containing Si, alkali metals, or alkaline earth metals with a subsequent process involving higher temperatures, and using only transparent materials for the low-emissivity applications.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, a transparent, thin film is deposited using sputtering to form a diffusion barrier above the surface of a substrate. Reactive sputtering, sputtering from a compound target, or reactive evaporation is used to form a bismuth oxide film above the diffusion barrier. The film stack may then be subjected to an anneal treatment to crystallize the bismuth oxide film.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
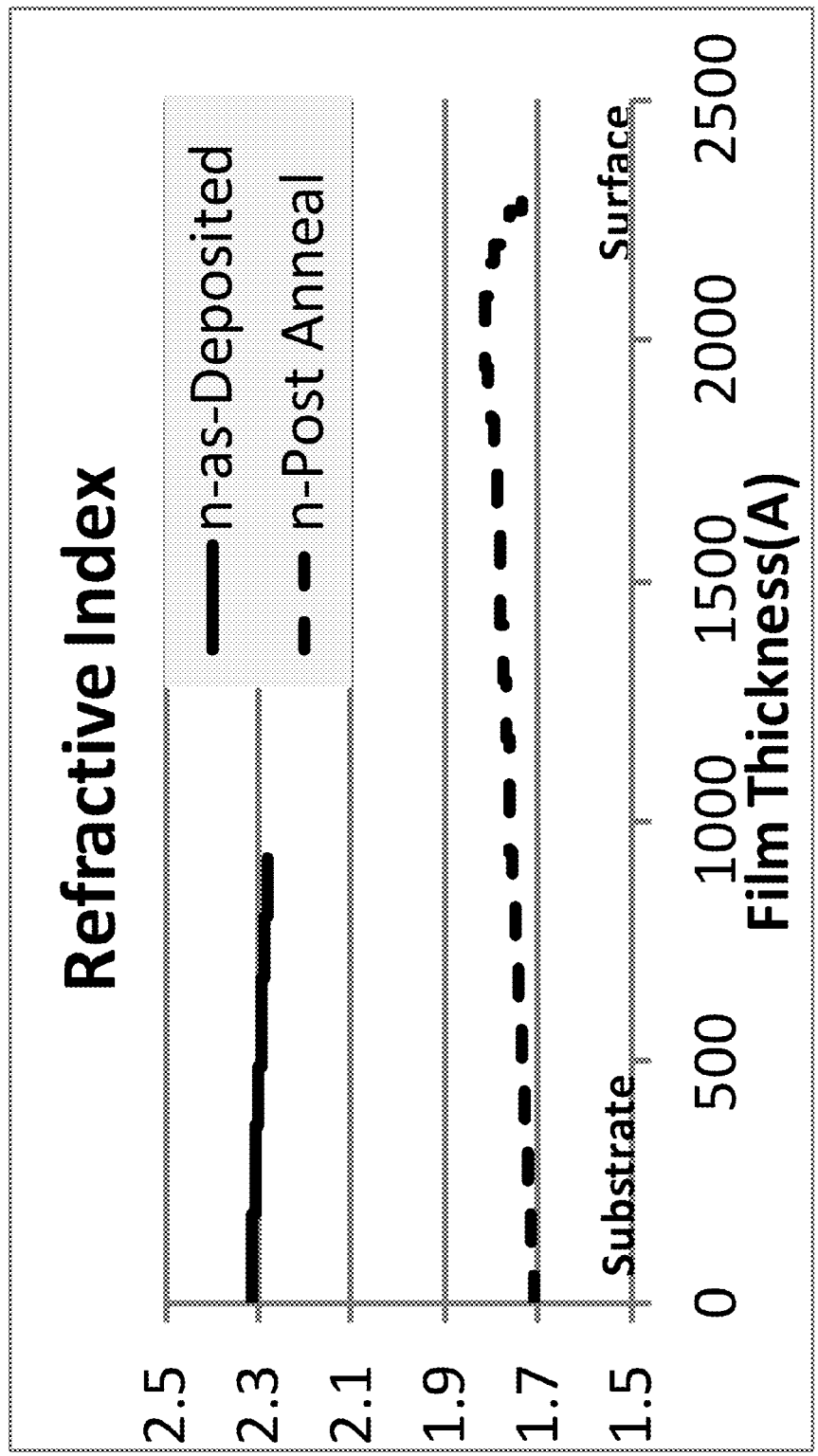
FIG. 1 presents data for the refractive index (n) as a function of depth through the bismuth oxide film after deposition and after an anneal treatment.

Bismuth oxide films were deposited on glass substrates using reactive sputtering. The temperature of the substrate was at room temperature (i.e. about 22 C.). The crystallinity of the as-deposited films was determined using x-ray diffraction (XRD). The as-deposited films were present as an amorphous phase. The bismuth oxide films were generally between about 10 nm and about 1000 nm in thickness. Advantageously, the bismuth oxide films were about 100 nm in thickness. The refractive index of the as-deposited films was determined to be about 2.3 as illustrated in FIG. 1. FIG. 1 illustrates a measurement of the refractive index uniformity as a function of depth through the film. The bismuth oxide/substrate interface is located at the left of the graph at the x=0 coordinate. The refractive index for the as-deposited film varied only slightly throughout the depth.

The bismuth oxide films were then subjected to an anneal treatment at about 650 C. for about 8 minutes in air. XRD of the bismuth oxide films after the anneal treatment indicated that the films still exhibited an amorphous phase. The refractive index of the films decreased to about 1.7 and was observed to be non-uniform throughout the thickness of the film as illustrated in FIG. 1. Further, the refractive index data in FIG. 1 reveal that the refractive index is lowest at the bottom of the film (i.e. closest to the substrate).

Figure 2A:
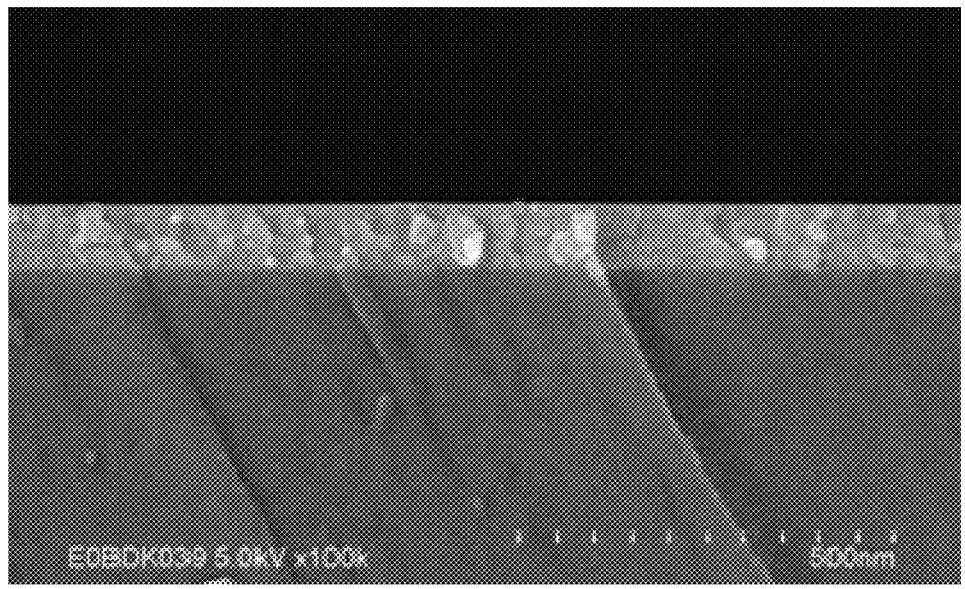
FIGS. 2A and 2B presents SEM micrographs for a bismuth oxide film after deposition and after an anneal treatment.
Figure 2B:
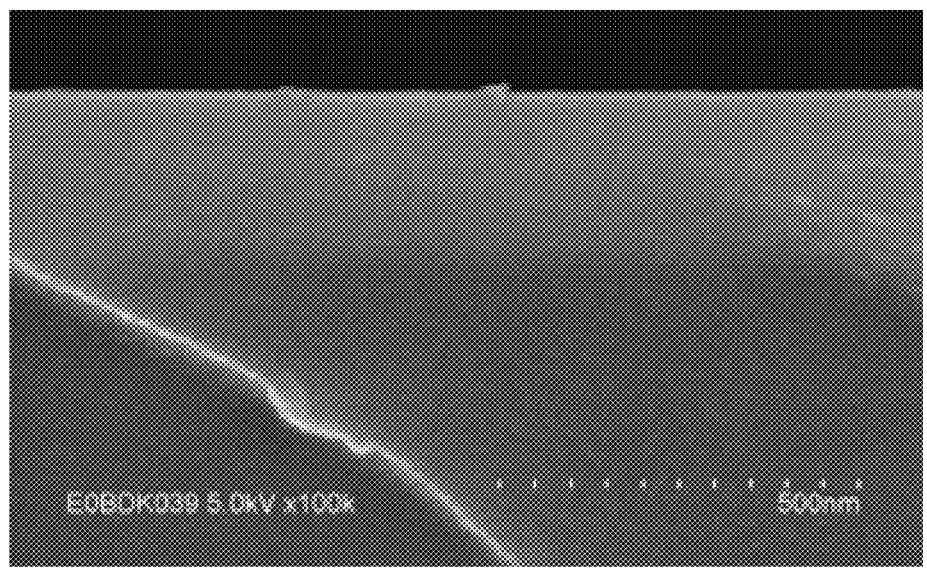

FIGS. 2A and 2B presents scanning electron microscope (SEM) micrographs for a bismuth oxide film after deposition and after an anneal treatment. FIG. 2A is an SEM micrograph of the as-deposited bismuth oxide film. FIG. 2B is an SEM micrograph of the bismuth oxide film after the anneal treatment. Note that the thickness of the film has increased by a factor of about 2×. Additionally, x-ray photoelectron spectroscopy (XPS) analysis of the bismuth oxide film after the anneal treatment indicated that many of the components of the glass had diffused into the film as impurities. Table 1 below presents data for the composition of the glass substrate and the XPS data for the bismuth oxide film after the anneal treatment.

TABLE 1

| | C (At %) | O (At %) | Na (At %) | Al (At %) | Si (At %) | Ca (At %) | Bi (At %) |
|---|---|---|---|---|---|---|---|
| Glass | na | 65.3 | 7.6 | 0.6 | 23.3 | 3.2 | na |
| Bi$_2$O$_3$ film | 11.5 | 52.5 | 8.3 | na | 15.3 | 1.9 | 10.6 |

The problems discussed above can be addressed by depositing a transparent diffusion barrier between the substrate and the bismuth oxide film. In some embodiments, the diffusion barrier is a transparent conductive oxide (TCO) material. Examples of suitable TCO materials comprise at least one of SnO$_2$, Al-doped tin oxide (Al:SnOx), Mg-doped tin oxide (Mg:SnOx) SnZnO$_4$, tin-doped aluminum oxide (Sn:AlOx), tin-doped magnesium oxide (Sn:MgOx), indium tin oxide (ITO). In some embodiments, the diffusion barrier is a dielectric material. Examples of suitable dielectric material comprise at least one of TiO$_x$, SiTiO$_x$, Si$_x$N$_y$.

In some embodiments of the present invention, a diffusion barrier layer was formed above a transparent substrate. Advantageously, the transparent substrate is glass, but may also be a polymer, plastic, ceramic, etc. In some embodiments, the diffusion barrier layer is titanium oxide. The thickness of the titanium oxide layer may be between about 0.5 nm and about 10 nm. Advantageously, the thickness of the titanium oxide layer between about 1 nm and about 5 nm. The diffusion barrier layer may be formed using reactive sputtering, sputtering from a compound target, or reactive evaporation.

Bismuth oxide films were deposited on the diffusion barrier layer using reactive sputtering. The temperature of the substrate was room temperature. The crystallinity of the as-deposited films was determined using x-ray diffraction (XRD). The as-deposited films were present as an amorphous phase. The bismuth oxide films were generally between about 10 nm and about 1000 nm in thickness. Advantageously, the bismuth oxide films were about 100 nm in thickness.

The bismuth oxide films were then subjected to an anneal treatment at about 650 C. for about 8 minutes in air. XRD of the bismuth oxide films after the anneal treatment indicated that the films still exhibited an amorphous phase. The refractive index of the films and was uniform throughout the thickness of the film.

The thickness for the bismuth oxide films deposited above the titanium oxide diffusion barrier did not change significantly after the anneal treatment as illustrated in Table 2. There is a small decrease in the thickness due to a densification of the film. This indicated that the titanium oxide was effective at preventing impurities from diffusion out of the substrate and into the bismuth oxide film. This is very different from the behavior observed in the first set of samples and illustrated in the SEM micrographs shown in FIG. 2.

TABLE 2

| TiO$_x$ Thickness | As Deposited Thickness Bi$_2$O$_3$ | After Anneal Thickness Bi$_2$O$_3$ |
|---|---|---|
| 112 Å | 673 Å | 660 Å |
| 114 Å | 821 Å | 768 Å |

The diffusion of impurities from the substrate into the bismuth oxide will be dependent upon subsequent temperature steps in the processing of the device. It is expected that some diffusion may occur at relatively low temperatures, even as low as room temperature. The optical and ionic conduction properties of the bismuth oxide will be sensitive to the presence of impurities. Therefore, the implementation of the diffusion barrier layer of the present invention will serve to overcome these difficulties.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a bismuth oxide film stack comprising:
    providing a transparent substrate;
    forming a first layer above the transparent substrate, wherein the first layer is operable as a diffusion barrier in the bismuth oxide film stack, and wherein the first layer comprises at least one of tin-doped magnesium oxide (Sn:MgOx) or silicon titanium oxide (SiTiO$_x$);
    forming a bismuth oxide layer above the first layer, wherein the bismuth oxide layer is formed using a reactive sputtering technique; and
    annealing the transparent substrate, the first layer, and the bismuth oxide layer.

2. The method of claim 1 wherein the first layer has a thickness of between about 0.5 nm and about 10 nm.

3. The method of claim 2 wherein the first layer comprises silicon titanium oxide (SiTiO$_x$).

4. The method of claim 1 wherein the first layer has a thickness between about 1 nm and about 5 nm, and the bismuth oxide layer has a thickness of between about 10 nm and about 1000 nm.

5. The method of claim 4 wherein the first layer comprises tin-doped magnesium oxide (Sn:MgOx).

6. The method of claim 1 wherein the bismuth oxide has a thickness of about 100 nm.

7. The method of claim 1 wherein the anneal treatment is performed at a temperature of about 650° C.

8. The method of claim 1 wherein the anneal treatment is performed for about 8 minutes.

9. The method of claim 1 wherein the anneal treatment is performed in an atmosphere comprising air.

10. The method of claim 1 wherein the transparent substrate comprises at least one of Si, alkali metals, or alkaline earth metals.

11. A method for forming a bismuth oxide film stack comprising:
    providing a transparent substrate;
    forming a dielectric layer above the transparent substrate, wherein the dielectric layer comprises silicon titanium oxide (SiTiO$_x$);
    forming a bismuth oxide layer above the dielectric layer, wherein the bismuth oxide layer is formed using a reactive sputtering technique; and
    annealing the transparent substrate, the dielectric layer, and the bismuth oxide layer.

12. The method of claim 11 wherein the dielectric layer has a thickness of between about 0.5 nm and about 10 nm.

13. The method of claim 12 wherein the dielectric layer has a thickness between about 1 nm and about 5 nm.

14. The method of claim 11 wherein the bismuth oxide layer has a thickness of between about 10 nm and about 1000 nm.

15. The method of claim 11, wherein the transparent substrate comprises glass.

* * * * *